United States Patent
Hiyama et al.

(10) Patent No.: US 7,968,365 B2
(45) Date of Patent: Jun. 28, 2011

(54) METHOD FOR MANUFACTURING SOLID-STATE IMAGING DEVICE

(75) Inventors: Susumu Hiyama, Kanagawa (JP); Tomoyuki Hirano, Kanagawa (JP)

(73) Assignee: Sony Corporation, Tokyo (JP)

(*) Notice: Subject to any disclaimer, the term of this patent is extended or adjusted under 35 U.S.C. 154(b) by 334 days.

(21) Appl. No.: 12/364,130

(22) Filed: Feb. 2, 2009

(65) Prior Publication Data
US 2009/0209056 A1  Aug. 20, 2009

(30) Foreign Application Priority Data
Feb. 19, 2008  (JP) .................... 2008-037037

(51) Int. Cl.
*H01L 31/06* (2006.01)
*H01L 31/0216* (2006.01)
(52) U.S. Cl. ............. 438/60; 257/E27.13; 257/E31.052; 257/E27.148; 257/E31.078; 257/E31.075; 438/57; 438/75
(58) Field of Classification Search ............. 257/E27.13, 257/E31.052, E27.148, E31.078, E31.075, 257/E27.163; 438/57
See application file for complete search history.

(56) References Cited

U.S. PATENT DOCUMENTS
2007/0034981 A1 *  2/2007  Saito .................... 257/462

FOREIGN PATENT DOCUMENTS
JP  2003-031785  1/2003

* cited by examiner

*Primary Examiner* — Thanh V Pham
*Assistant Examiner* — Mohammad Choudhry
(74) *Attorney, Agent, or Firm* — SNR Denton US LLP

(57) ABSTRACT

A method for manufacturing a solid-state imaging device in which a charge generator that detects an electromagnetic wave and generates signal charges is formed on a semiconductor substrate and a negative-charge accumulated layer having negative fixed charges is formed above a detection plane of the charge generator, the method includes the steps of: forming an oxygen-feed film capable of feeding oxygen on the detection plane of the charge generator; forming a metal film that covers the oxygen-feed film on the detection plane of the charge generator; and performing heat treatment for the metal film in an inactive atmosphere to thereby form an oxide of the metal film between the metal film and the oxygen-feed film on the detection plane of the charge generator, the oxide being to serve as the negative-charge accumulated layer.

13 Claims, 9 Drawing Sheets

FIG.5
<<EMBODIMENT>>
<WITH HAD STRUCTURE FORMED BY
  NEGATIVE-CHARGE ACCUMULATED LAYER>
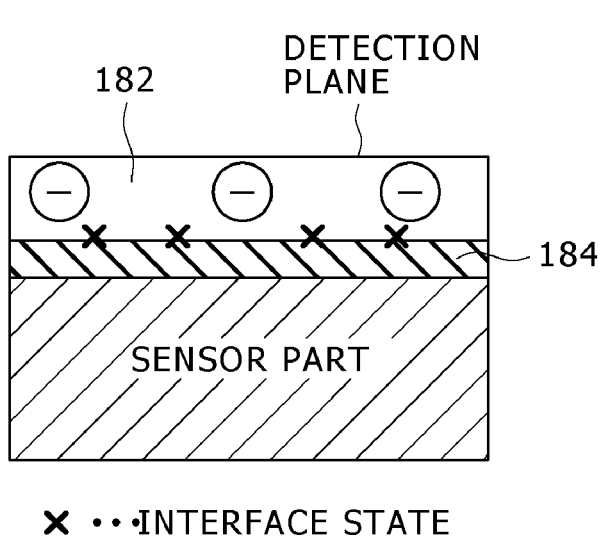
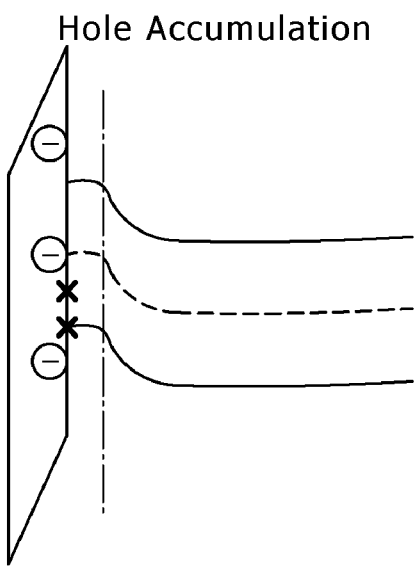
FORMED BY NEGATIVE FIXED
CHARGES IN NEGATIVE-CHARGE
ACCUMULATED LAYER 182

<<COMPARATIVE EXAMPLE>>

METAL OXIDE FILM IS DEPOSITED

CRYSTALLIZATION ANNEALING TREATMENT OF METAL OXIDE FILM

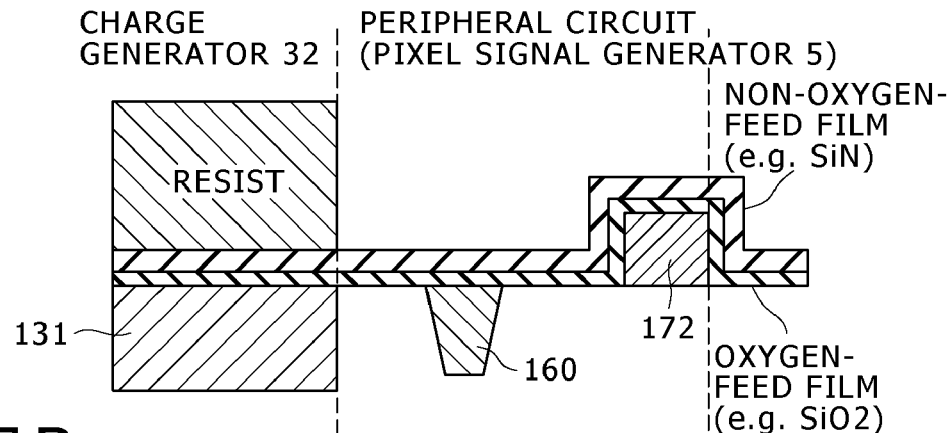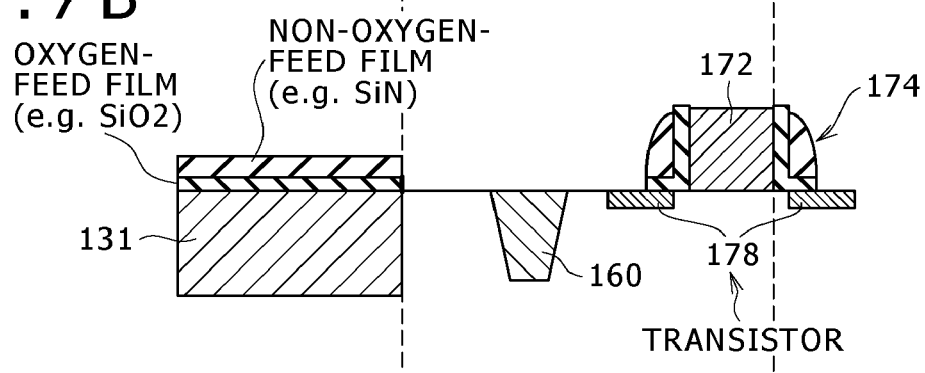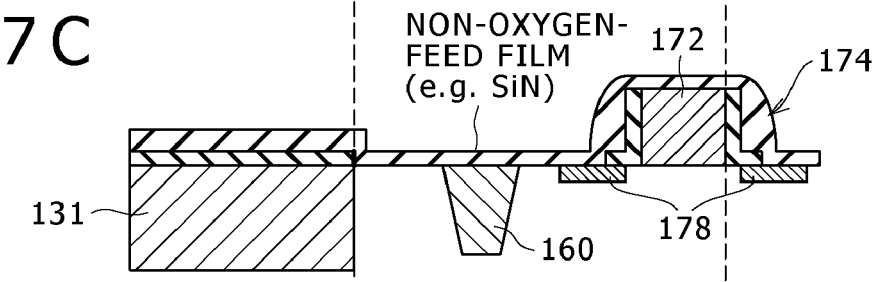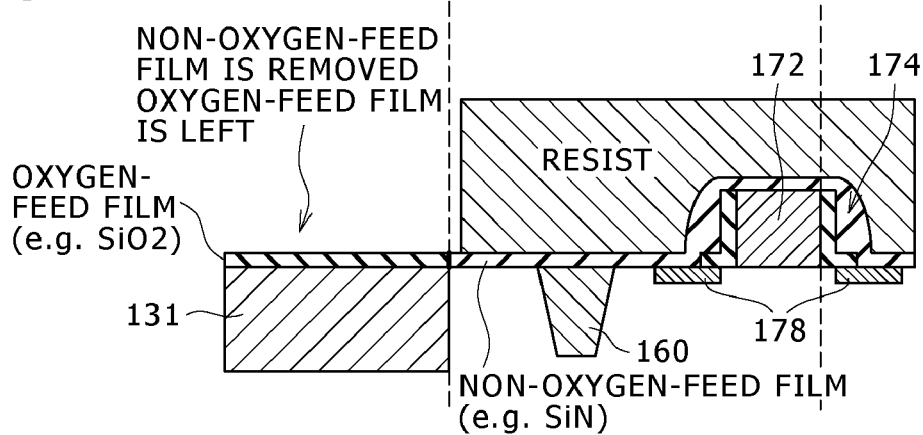

<<EMBODIMENT (SUBSEQUENT TO FIG. 7D)>>

<<COMPARATIVE EXAMPLE>>
<WITHOUT HAD STRUCTURE>

✕ ・・・INTERFACE STATE

<<COMPARATIVE EXAMPLE>>
<WITH HAD STRUCTURE FORMED BY ION IMPLANTATION>

✕ ・・・INTERFACE STATE

METHOD FOR MANUFACTURING SOLID-STATE IMAGING DEVICE

CROSS REFERENCES TO RELATED APPLICATIONS

The present invention contains subject matter related to Japanese Patent Application JP 2008-037037 filed in the Japan Patent Office on Feb. 19, 2008, the entire contents of which being incorporated herein by reference.

BACKGROUND OF THE INVENTION

1. Field of the Invention

The present invention relates to a method for manufacturing a solid-state imaging device of a charge coupled device (CCD) type, a metal oxide semiconductor (MOS) type, or a complementary metal oxide semiconductor (CMOS) type. More specifically, the present invention relates to a method for manufacturing a solid-state imaging device employing a hole accumulation (accumulated) diode (HAD) structure as a technique for preventing dark current that possibly arises in a sensor part and the periphery thereof.

2. Description of the Related Art

A solid-state imaging device (referred to also as an image sensor), such as a CCD image sensor and a CMOS image sensor, including plural charge generators (sensor parts) each formed of a photoelectric conversion element (such as a photo diode) in an imaging unit is being used as a device for capturing an image in various fields.

In a general solid-state imaging device, the respective light-receiving elements that each serve as major part of the sensor part (light-receiving part) and are each formed of a photo diode or the like receive incident light through the light-receiving planes and carry out photoelectric conversion. The generated charges are detected by a detection circuit and then are amplified so as to be sequentially output.

As one configuration example of the solid-state imaging device, on an N-type silicon substrate (semiconductor substrate of a first conductivity type), a P-type impurity layer (P-well) as a semiconductor layer of a second conductivity type is formed. Furthermore, a sensor part (light-receiving part) including a charge accumulation layer (hereinafter, referred to also as a first sensor region) formed by ion implantation of an impurity of the first conductivity type into the semiconductor layer of the second conductivity type is formed. Signal charges obtained through light reception and photoelectric conversion are accumulated in this charge accumulation layer.

FIG. 9 is a diagram for explaining the occurrence of dark current in a configuration without a HAD structure. FIG. 10 is a diagram for explaining an advantage of a HAD structure formed by ion implantation in terms of suppression of the dark current. It is known that, in the solid-state imaging device, crystal defects in a photo diode and, as shown in FIG. 9, interface states at the interface between the photo diode and an insulating film thereon act as the sources of the dark current. As schemes for suppressing the occurrence of the dark current attributed to the interface states, e.g. a buried photo diode structure and a HAD structure are known.

The buried photo diode is obtained by forming a semiconductor region of a first conductivity type (e.g. n-type) (hereinafter, this region will be referred to as an n-type semiconductor region) and forming a shallow, heavily-doped semiconductor region of a second conductivity type (p-type) for dark current suppression (hereinafter, this region will be referred to as a hole accumulation region) on the surface of this n-type semiconductor region, i.e. in the vicinity of the interface with the insulating film. In a general method for fabricating the buried photo diode, ion implantation of boron (B) or boron fluoride (boron difluoride (BF2)) serving as the p-type impurity and annealing treatment (heat treatment) are performed to thereby fabricate the p-type semiconductor region in the vicinity of the interface between the n-type semiconductor region of the photo diode and the insulating film.

As shown in FIG. 10, the HAD structure is obtained by stacking a hole accumulation layer (hereinafter, referred to also as a second sensor region) formed of a P+-type impurity region on a charge accumulation layer formed of an N+-type impurity region on the surface side of the NP diode. The following description will deal with the HAD structure formed by ion implantation.

In a configuration without the HAD structure like that shown in FIG. 9, electrons generated attributed to interface states flow into the photo diode as dark current. In contrast, the HAD structure like that shown in FIG. 10 can suppress the dark current attributed to the interface states by the hole accumulation layer formed near the interface.

Specifically, the solid-state imaging device of the HAD structure includes a sensor part of a HAD sensor structure having the hole accumulation layer that is stacked on a signal charge accumulation layer for accumulating charges generated depending on incident light in order to enhance the sensitivity and suppress surface dark current. As described above, the signal charge accumulation layer is formed by ion implantation of an N+-type impurity, and the hole accumulation layer is formed by ion implantation of a P+-type impurity. In this sensor part of the HAD sensor structure, the N-type semiconductor layer (signal charge accumulation layer) existing under the hole accumulation layer and the P-type semiconductor layer existing under the N-type semiconductor layer serve as a photo diode that carries out photoelectric conversion. In the solid-state imaging device having such a HAD structure, electrons generated in the vicinity of the substrate surface due to thermal excitation are trapped by the hole accumulation layer, and thus the occurrence of dark current is suppressed, which provides enhanced sensitivity.

On the other hand, there has been proposed a back-irradiation solid-state imaging device as a device having the buried photo diode structure (refer to Japanese Patent Laid-open No. 2003-31785 (hereinafter, Patent Document 1)). To obtain this device, the backside of a silicon substrate in which photodiodes and various transistors are formed is polished to decrease the thickness of the substrate. This allows light entry from the backside of the substrate for photoelectric conversion. As described above, a shallow, heavily-doped p-type semiconductor region (hole accumulation region) is formed in the photo diode part in order to suppress dark current. In the case of the back-irradiation solid-state imaging device, this hole accumulation region is formed on both the front side and the backside of the substrate.

SUMMARY OF THE INVENTION

However, in the forming of the buried photo diode by use of an existing ion implantation method, heat treatment at a high temperature of 700° C. or higher is essential for impurity activation. Therefore, it is difficult for a low-temperature process with temperatures of 400° C. or lower to form the p-type semiconductor region by ion implantation. In addition, also when it is desired to avoid the activation at a high temperature for a long time in order to suppress impurity diffusion, it is not preferable to employ this method for forming the p-type semiconductor region, including ion implantation and annealing.

Furthermore, in the manufacturing method of Patent Document 1, there is a limit to the forming of the shallow, heavily-doped p-type semiconductor region by ion implantation. Therefore, if increasing of the impurity concentration of the p-type semiconductor region is attempted for dark current suppression, the p-type semiconductor region will range to a deeper zone. The deeper p-type semiconductor region leads to larger distance between the p-n junction of the photodiode and a transfer gate, and hence possibly lowers the capability of readout by the transfer gate.

In the HAD structure, the part in which signal charges are accumulated is the signal charge accumulation layer, in which the potential is high. In readout of signal charges accumulated in this signal charge accumulation layer, a channel is made by applying voltage to the transfer gate via a transfer gate electrode, to thereby transfer the charges to a floating diffusion region.

However, in the solid-state imaging device in which the HAD structure is used for the sensor part (light-receiving region), in order to completely transfer signal charges in the HAD structure to e.g. an FD part by the transfer gate electrode for the surface channel, it is demanded to employ profile design in which the N-type signal charge accumulation layer, which is the part in which signal charges are accumulated on the surface side of the semiconductor substrate of the HAD structure, is formed in a shallow zone. The reason for this is that a deeper signal charge accumulation layer leads to lower transfer efficiency because the channel (charge transfer channel) by the gate is formed near the substrate surface. Therefore, it is desirable to form the signal charge accumulation layer in as shallow a zone as possible.

To form the signal charge accumulation layer in a shallow zone, the thickness of the hole accumulation layer provided on the signal charge accumulation layer needs to be correspondingly small. This means that the hole accumulation layer having small thickness is formed in a zone that is extremely shallow from (close to) the silicon surface of the HAD structure. However, the depth of the hole accumulation layer and dark current attributed to interface states near the HAD surface are in a trade-off relationship, and forming a shallow hole accumulation layer possibly increases the dark current. For example, there are a large number of interface states near the silicon surface. For suppression of the dark current arising due to the interface states, a P+-type impurity is heavily implanted so that the state in which the interface states are filled with holes (called pinning) may be formed, i.e. so that the junction may be prevented from being in direct contact with the interface states. This contradicts the demand for the hole accumulation layer to have small thickness.

In addition, the depth of the hole accumulation layer is easily affected by variation in the thickness of the film stacked on the HAD at the time of ion implantation in the forming of the hole accumulation layer. As the depth of the hole accumulation layer is decreased, the influence of variation in the depth on increase in dark current becomes larger. If the signal charge accumulation layer can be formed in a deep zone and a certain degree of thickness of the hole accumulation layer can be ensured, the influence is vanishingly small even when the thickness has some variation. However, smaller thickness yields larger synergistic influence. As above, in order to form the HAD structure, ingenuity in the manufacturing method thereof is needed.

There is a need for the present embodiment to provide a scheme capable of reducing dark current that possibly arises in a sensor part and the periphery thereof attributed to interface states. In particular, there is a need for the present embodiment to provide a novel manufacturing method for forming a HAD structure.

According to one embodiment of the present invention, there is provided a method for manufacturing a solid-state imaging device in which a charge generator that detects an electromagnetic wave such as light to thereby generate signal charges and is formed mainly of a photo diode is formed on a semiconductor substrate and a negative-charge accumulated layer having negative fixed charges is formed above the detection plane of the charge generator. In the method, an oxygen-feed film capable of feeding oxygen is formed on the detection plane of the charge generator (oxygen-feed film forming step). Thereafter, a metal film is so formed as to cover the oxygen-feed film on the detection plane of the charge generator (metal film forming step), and heat treatment (annealing treatment) is performed for this metal film in an inactive atmosphere to thereby form an oxide of the metal film between the metal film and the oxygen-feed film on the detection plane of the charge generator (oxidation heat treatment step). The oxide is to serve as the negative-charge accumulated layer. Preferably, the unoxidized metal film that remains after the heat treatment is removed (metal film removing step).

If a peripheral circuit is disposed that has a transistor and includes a pixel signal generator that generates a pixel signal based on signal charges generated by the charge generator, a drive controller that is disposed on the periphery of the charge generator and the pixel signal generator and has a control circuit function to read out a pixel signal generated by the pixel signal generator to the outside of the pixel signal generator and the device, and a signal processor that processes a pixel signal read out from the pixel signal generator, the following steps are carried out. An oxygen-feed film capable of feeding oxygen is formed on the detection plane of the charge generator (oxygen-feed film forming step). Furthermore, a non-oxygen-feed film that contains no oxygen is formed on the semiconductor substrate in the area including the peripheral circuit except for the area of the detection plane of the charge generator (non-oxygen-feed film forming step). Subsequently, a metal film is so formed as to cover the oxygen-feed film on the detection plane of the charge generator and the non-oxygen-feed film on the semiconductor substrate in the area including the peripheral circuit except for the area of the detection plane of the charge generator (metal film forming step). Thereafter, heat treatment (annealing treatment) is performed for this metal film in an inactive atmosphere to thereby form an oxide of the metal film between the metal film and the oxygen-feed film on the detection plane of the charge generator (oxidation heat treatment step). The oxide is to serve as the negative-charge accumulated layer. Subsequently, the unoxidized metal film that remains after the heat treatment is removed (metal film removing step).

That is, the state is formed in which the non-oxygen-feed film does not exist but the oxygen-feed film exists on the detection plane of the charge generator as the area above which the oxide insulating film, which is to serve as the negative-charge accumulated layer later, is desired to be left whereas, in consideration of a transistor in the peripheral circuit, the oxygen-feed film does not exist but the non-oxygen-feed film exists in the area including the peripheral circuit except for the area of the detection plane as the area above which the oxide insulating film is not desired to be left. Subsequently, the metal film as the base material of the oxide insulating film, which is to serve as the negative-charge accumulated layer later, is so deposited as to cover the entire area, and then the heat treatment is performed. Thereby, the insulating film composed of the oxide of the metal element is formed between the oxygen-feed film and the metal film above the detection plane of the charge generator. At this time, in the area including the peripheral circuit except for the area of the detection plane, thermal reaction between the non-oxygen-feed film and the metal film does not occur, and thus the oxide insulating film is not formed. The metal film can be removed by etching more easily compared with the oxide insulating film. Based on this characteristic, removal processing such as dry etching or wet etching is performed for the whole of the areas of the charge generator and the peripheral circuit thereof, to thereby remove the metal film, which is easy to remove, formed on the non-oxygen-feed film in the area including the peripheral circuit except for the area of the detection plane while leave the metal oxide film, which is difficult to remove, above the detection plane.

According to the embodiment of the present invention, in the manufacturing of the solid-state imaging device in which the negative-charge accumulated layer is formed above the detection plane of the charge generator, the oxygen-feed film is formed on the detection plane of the charge generator, and the non-oxygen-feed film is formed in the area including the peripheral circuit except for the area of the detection plane of the charge generator as the area above which the oxide insulating film is not desired to be left. Subsequently, the metal film as the base material of the oxide insulating film, which is to serve as the negative-charge accumulated layer later, is deposited on the oxygen-feed film and the non-oxygen-feed film, and then the heat treatment is performed in an inactive atmosphere.

Above the detection plane of the charge generator, the metal film thermally reacts with the underlying oxygen-feed film and a metal oxide film is formed at the boundary part. On the other hand, above the area including the peripheral circuit except for the area of the detection plane of the charge generator, the metal film does not thermally react with the underlying non-oxygen-feed film but the state of the metal film is kept. Thus, by performing removal treatment such as etching for the entire area, the metal film is removed from the area including the peripheral circuit except for the area of the detection plane, whereas the metal oxide film is left above the detection plane. By these steps, the oxide insulating film can be formed only above the detection plane of the charge generator, and it is possible to allow this oxide insulating film to function as the negative-charge accumulated layer.

Due to the forming of the negative-charge accumulated layer having negative fixed charges above the detection plane of the charge generator, a HAD structure for turning the surface of the charge generator into the hole accumulated state can be achieved, which allows suppression of dark current components attributed to interface states. Furthermore, the detection plane of the charge generator can be turned to the hole accumulated state without ion implantation and impurity activation annealing for forming a hole accumulation layer, or even with a small dose amount, and thus dark current attributed to interface states can be suppressed.

BRIEF DESCRIPTION OF THE DRAWINGS

FIG. 5 is a diagram for explaining an advantage of a hole accumulation region according to an embodiment of the present invention;

FIGS. 7A to 7D are diagrams for explaining the manufacturing procedure of the hole accumulation region according to the embodiment;

DETAILED DESCRIPTION OF THE PREFERRED EMBODIMENT

An embodiment of the present invention will be described in detail below with reference to the drawings. The following description will deal with an example in which a CMOS solid-state imaging device, which is one example of an X-Y address type solid-state imaging device, is used as the device relating to the embodiment. The description is based on an assumption that all of the pixels in the CMOS solid-state imaging device are formed of NMOS.

However, this assumption is merely one example and the device relating to the embodiment is not limited to a MOS solid-state imaging device. All of the embodiment to be described later can be similarly applied to all of semiconductor devices for detecting the distribution of a physical quantity, formed by arranging, in a line or a matrix, plural unit components having sensitivity to an electromagnetic wave such as light or radiation input from the external.

<Outline of Entire Solid-State Imaging Device>

Figure 1:
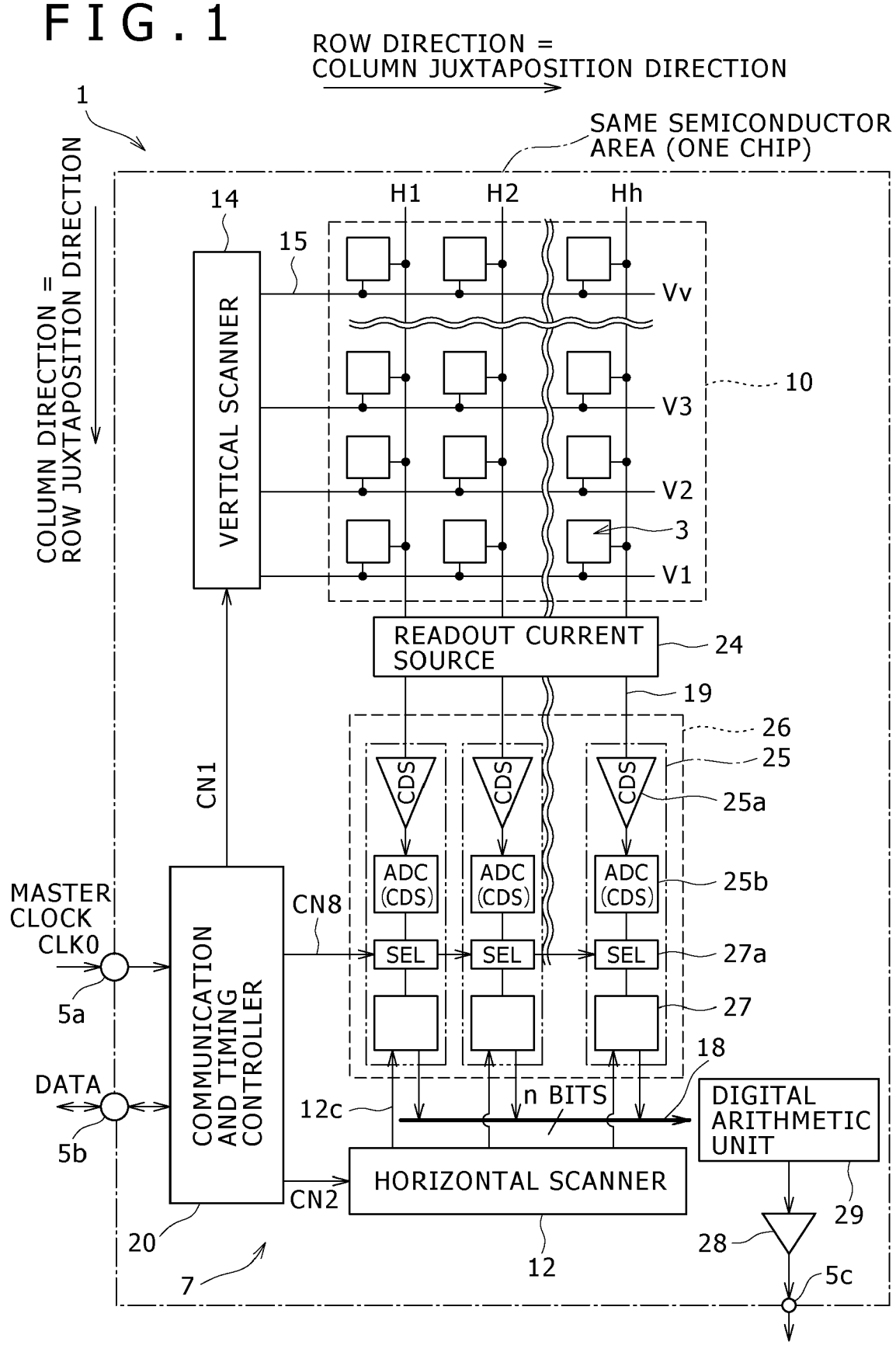
FIG. 1 is a schematic configuration diagram of a CMOS solid-state imaging device.

FIG. 1 is a schematic configuration diagram of a CMOS solid-state imaging device (CMOS image sensor) as the solid-state imaging device according to one embodiment of the present invention. As shown in the diagram, a solid-state imaging device 1 includes a pixel array unit 10 (pixel unit) and a peripheral circuit unit 11.

In the pixel array unit 10, unit pixels 3 each having a light-receiving element (one example of the charge generator) that outputs the signal dependent on the incident light amount and a pixel signal generator are provided (see FIG. 2 to be described later). In the peripheral circuit unit 11, a drive controller 7 having a control circuit function for sequentially reading out the signals of the pixel array unit 10 to the outside of the pixel array unit 10 and to the outside of the chip, and a signal processor (column processor 26) that processes pixel signals So read out from the pixel array unit 10 are provided. Transistors are used for these units.

For example, as shown in FIG. 1, the solid-state imaging device 1 of the present embodiment includes the pixel array unit 10 that has the plural unit pixels 3 arranged on rows and columns and is referred to also as a pixel unit and an imaging unit, the drive controller 7 provided outside the pixel array unit 10, and a readout current source 24 that supplies operating current (readout current) for readout of the pixel signals to the unit pixels 3 in the pixel array unit 10. In addition, the solid-state imaging device 1 includes the column processor 26 having column circuits 25 each provided for a respective one of the vertical columns, and an output circuit 28 (sense amplifier (S/A)).

The pixel array unit 10 in the solid-state imaging device 1 can be made compatible with color imaging by using a color separation filter. Specifically, the pixel array unit 10 is made capable of capturing a color image by providing some color filters of the color separation filter, which is formed of combination of color filters of plural colors for capturing a color image, based on e.g. the so-called Bayer arrangement on the light-receiving planes of the respective charge generators (e.g. photo diodes), on which an electromagnetic wave (light, in the present example) is incident, in the pixel array unit 10.

The column circuit 25 executes differential processing (correlated double sampling (CDS) processing) for the difference between the signal level immediately after pixel reset as the reference level of the pixel signal So (hereinafter, this signal level will be referred to as the reset level) and the signal level after photoelectric conversion (hereinafter, referred to simply as the signal level). This allows the column circuit 25 to have the functions of a differential processor 25a that acquires a signal component indicated by the difference between the reset level and the signal level and an AD converter (ADC) 25b that converts the signal component equivalent to the difference between the reset level as the reference level of the pixel signal and the signal level into N-bit digital data. The arrangement order of the differential processor 25a and the AD converter 25b may be any. It is not essential to convert the pixel signal into digital data by the AD converter 25b. By the differential processing by the differential processor 25a, noise signal components such as fixed pattern noise (FPN) and reset noise can be removed.

Digital data obtained through AD conversion of pixel signal voltage Vx by the column circuit 25 does not necessarily need to be horizontally transferred, but it is also possible to horizontally transfer analog information corresponding to the pixel signal voltage Vx. In this case, it is preferable that the differential processor 25a acquire the difference between the reset level Srst of the pixel signal voltage Vx and the signal level Ssig thereof for each pixel column.

The drive controller 7 has a control circuit function for sequentially reading out the signals of the pixel array unit 10. For example, the drive controller 7 includes a horizontal scanner 12 (column scan circuit), a vertical scanner 14 (row scan circuit), and a communication and timing controller 20. The horizontal scanner 12 has the function of a readout scanner that selects in order the column address of the column circuit 25 in the column processor 26 in synchronization with a clock and reads out data arising from digital conversion of the pixel signal to a horizontal signal line 18. The vertical scanner 14 selects the row address of the pixel array unit 10 and supplies the pulse necessary for the row. The communication and timing controller 20 has a function to generate an internal clock, and so on.

The unit pixel 3 is connected to the vertical scanner 14 via a row control line 15 for row selection and connected to the column processor 26, in which the column circuit 25 is provided for each vertical column, via a vertical signal line 19. The row control lines 15 encompass the overall interconnects that extend from the vertical scanner 14 and are connected to the pixels. The horizontal signal line 18 is a bus line for transferring the data produced by the column circuits 25.

Although not shown in the drawing, the communication and timing controller 20 includes a function block of a timing generator TG (one example of a readout address control device) that supplies the clock necessary for the operation of the respective units and a pulse signal of a predetermined timing. Furthermore, the communication and timing controller 20 includes a function block of a communication interface that receives a master clock CLK0 supplied from an external main controller via a terminal 5a and data that is supplied from the external main controller and indicates the operation mode and so on via a terminal 5b, and outputs data including information on the solid-state imaging device 1 to the external main controller.

The peripheral circuit unit 11, which includes the respective elements of the drive controller 7, such as the horizontal scanner 12 and the vertical scanner 14, and the column processor 26, is so configured as to serve as a part of the solid-state imaging device 1 of the present embodiment as a CMOS image sensor as one example of a semiconductor system, as a so-called one-chip unit that is formed in a semiconductor area such as single-crystal silicon by using a technique similar to a semiconductor integrated circuit manufacturing technique integrally with the pixel array unit 10 (as a unit provided on the same semiconductor substrate).

The solid-state imaging device 1 may be formed as one chip in which the respective units are formed in a semiconductor area integrally with each other in this manner. Alternatively, although not shown in the drawing, the solid-state imaging device 1 may have a module form that has an imaging function and is obtained by collectively packaging an optical system including a photographic lens, an optical low-pass filter, an infrared cut filter, and so on in addition to the various kinds of signal processors, such as the pixel array unit 10, the drive controller 7, and the column processor 26.

In the case of a basic configuration without a data memory and transfer output unit 27, the output of the AD converter 25b or the differential processor 25a is connected to the horizontal signal line 18. If analog data is subjected to differential processing by the differential processor 25a and thereafter the analog data is converted into digital data by the AD converter 25b, the output of the AD converter 25b is connected to the horizontal signal line 18. In contrast, if the differential processing by the differential processor 25a is executed after the conversion into digital data by the AD converter 25b, the output of the differential processor 25a is connected to the horizontal signal line 18. The following description is premised on the former case, which is shown in FIG. 1.

To the AD converter 25b, a control pulse (horizontal data transfer clock φH) is input from the horizontal scanner 12 via a control line 12c. The AD converter 25b has a latch function to hold a count result and holds data until receiving an instruction by the control pulse via the control line 12c.

In the present embodiment, the output side of each column circuit 25 includes, after the AD converter 25b, the data memory and transfer output unit 27 as an N-bit memory device that holds the count result held by the AD converter 25b and a switch 27a (SEL) as one example of a data switcher disposed between the AD converter 25b and the data memory and transfer output unit 27, as shown in FIG. 1. If a configuration including the data memory and transfer output unit 27 is employed, a memory transfer instruction pulse CN8 as a control pulse is supplied from the communication and timing controller 20 to the switch 27a at a predetermined timing in common to the switches 27a on the other vertical columns.

Upon receiving the memory transfer instruction pulse CN8, the switch 27a transfers data from the AD converter 25b on the same column to the data memory and transfer output unit 27 based on a load function. The data memory and transfer output unit 27 holds and stores the transferred data.

In matching with the provision of the switches 27a, the horizontal scanner 12 of the present embodiment has a function of a readout scanner that reads out the data held by the respective data memory and transfer output units 27 in parallel with the execution of processing assigned to the differential processors 25a and the AD converters 25b in the column processor 26.

If a configuration including the data memory and transfer output unit 27 is employed, AD-converted data held by the AD converter 25b can be transferred to the data memory and transfer output unit 27. Therefore, the AD conversion processing by the AD converter 25b and the operation of readout of the AD conversion result to the horizontal signal line 18 can be controlled independently of each other. This allows pipeline operation of concurrently executing the AD conversion processing and the operation of readout of signals to the external.

For example, the AD conversion is completed by latching (holding and storing) the AD conversion result of pixel data in the AD converter 25b. Thereafter, the pixel data is transferred to the data memory and transfer output unit 27 at a predetermined timing so as to be stored and held therein. Thereafter, the column circuit 25 sequentially outputs the pixel data stored and held in the data memory and transfer output unit 27 to the outside of the column processor 26 and to the outside of the chip having the pixel array unit 10 from an output terminal 5c, based on shift operation synchronized with the control pulse input from the horizontal scanner 12 via the control line 12c at a predetermined timing.

<Circuit Configuration Example of Unit Pixel>

Figure 2:
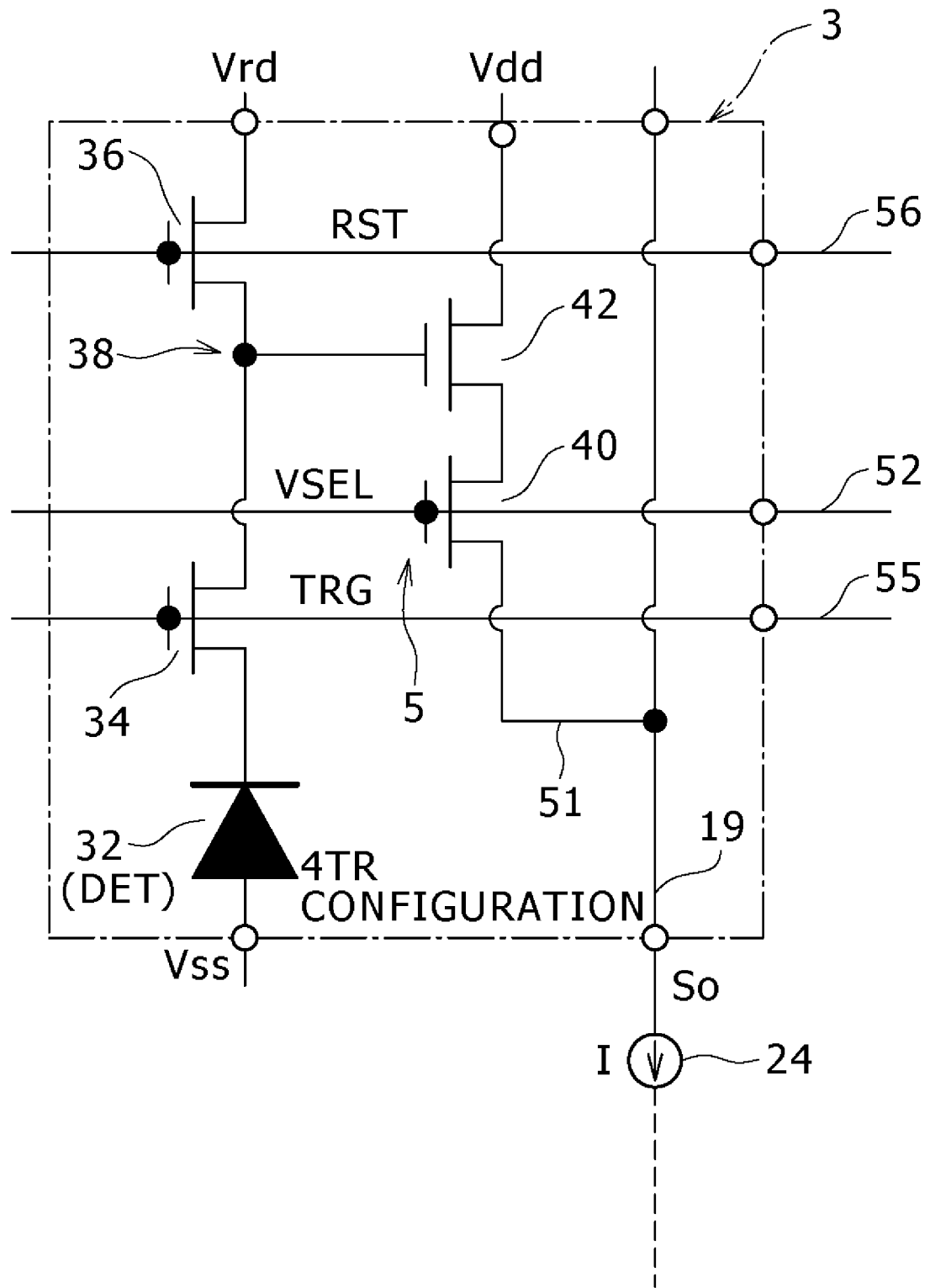
FIG. 2 is a diagram showing a typical circuit configuration example of a unit pixel.

FIG. 2 is a diagram showing a typical circuit configuration example (4TR configuration) of the unit pixel used in the solid-state imaging device 1 shown in FIG. 1.

The configuration of the unit pixel 3 is similar to that of a normal CMOS image sensor. As the amplifier in the pixel, e.g. one having a floating diffusion amplifier configuration is used. As one example, it is possible to use the 4TR configuration composed of four transistors, which is a general configuration as a CMOS sensor, or a 3TR configuration composed of three transistors. Specifically, the 4TR configuration has the following four transistors for the charge generator: a readout selection transistor as one example of a charge readout part (transfer gate part/readout gate part); a reset transistor as one example of a reset gate part; a vertical selection transistor; and an amplification transistor with a source-follower configuration as one example of a detection element that detects potential change of the floating diffusion region. FIG. 2 shows the 4TR configuration.

The unit pixel 3 with the 4TR configuration has a charge generator 32 whose major part is formed of a photo diode or the like, a readout selection transistor 34 (transfer transistor) to which a transfer pulse TRG is supplied, a reset transistor 36 to which a reset pulse RST is supplied, a floating diffusion region 38, a vertical selection transistor 40 to which a vertical selection pulse VSEL is supplied, and an amplification transistor 42. The reset transistor 36, the floating diffusion region 38, the vertical selection transistor 40, and the amplification transistor 42 form a pixel signal generator 5.

For the charge generator 32 as one example of a detector having a light-receiving element DET such as a photo diode PD as its major part, one terminal (anode side) of the light-receiving element DET is coupled to a reference potential Vss (negative potential of e.g. about −1 V) on the lower potential side, and the other terminal (cathode side) thereof is connected to the input terminal (typically, the source) of the readout selection transistor 34. A ground potential GND is often employed as the reference potential Vss.

The output terminal (typically, the drain) of the readout selection transistor 34 is coupled to a connecting node to which the reset transistor 36, the floating diffusion region 38, and the amplification transistor 42 are connected. The transfer pulse TRG is supplied to the control input terminal (gate) of the readout selection transistor 34.

For the reset transistor 36 in the pixel signal generator 5, the source thereof is connected to the floating diffusion region 38 and the drain thereof is connected to a reset power supply Vrd (normally a power supply Vdd is used as it in common), and the pixel reset pulse RST is input to the gate (reset gate RG) thereof.

For the vertical selection transistor 40, as one example, the drain and source thereof are connected to the source of the amplification transistor 42 and a pixel line 51, respectively, and the gate (referred to as the vertical selection gate SELV particularly) thereof is connected to a vertical selection line 52. The connection configuration relating to the vertical selection transistor 40 is not limited thereto, but the positions of the vertical selection transistor 40 and the amplification transistor 42 may be interchanged; the drain and source of the vertical selection transistor 40 may be connected to the power supply Vdd and the drain of the amplification transistor 42, respectively, and the source of the amplification transistor 42 may be connected to the pixel line 51. The vertical selection pulse VSEL is applied to the vertical selection line 52.

The gate of the amplification transistor 42 is connected to the floating diffusion region 38 and the drain thereof is connected to the power supply Vdd. The source thereof is connected to the pixel line 51 via the vertical selection transistor 40 and to the vertical signal line 19.

The vertical signal line 19 extends toward the column processor 26. On the extension path, the readout current source 24 (specifically, a constant current source I inside thereof) serving as a current source is connected to the vertical signal line 19, so that a source-follower configuration to which a substantially-constant operating current (readout current) is supplied is formed with the amplification transistor 42.

The reset transistor 36 resets the floating diffusion region 38. The readout selection transistor 34 transfers signal charges generated by the charge generator 32 to the floating diffusion region 38. Because the floating diffusion region 38 is connected to the gate of the amplification transistor 42, the amplification transistor 42 outputs the signal dependent on the potential of the floating diffusion region 38 (hereinafter, referred to as the FD potential) to the vertical signal line 19 via the pixel line 51 in a voltage mode. A large number of pixels are connected to the vertical signal line 19. Thus, for pixel selection, only the vertical selection transistor 40 in the selected pixel is turned on. Thereupon, only the selected pixel is connected to the vertical signal line 19 and the signal of the selected pixel is output to the vertical signal line 19.

Because the respective gates of the readout selection transistor 34, the reset transistor 36, and the vertical selection transistor 40 are connected on a row-by-row basis, the transistors in the respective pixels on one row are simultaneously operated.

<Sectional Structure of Unit Pixel>

Figure 3:
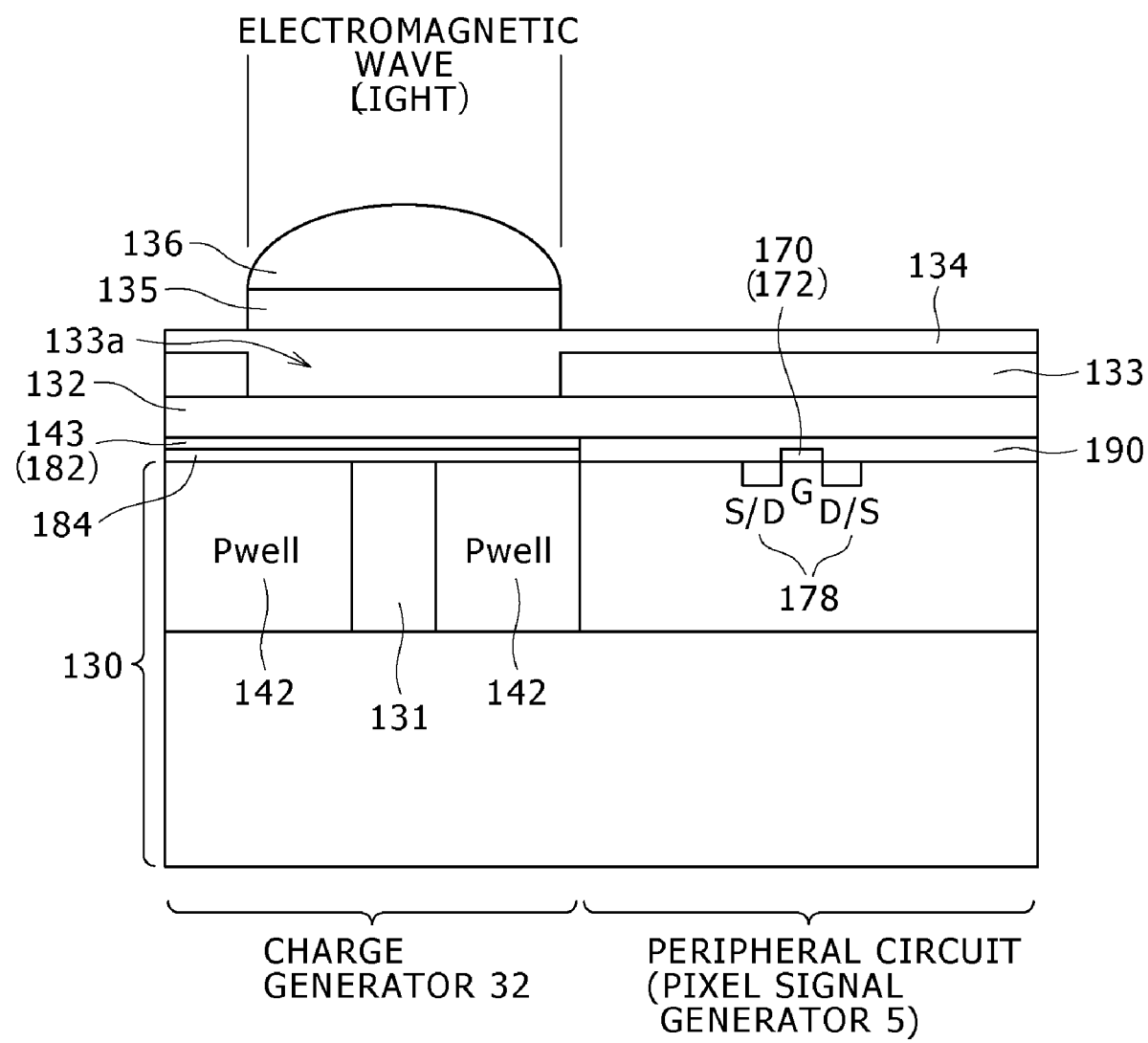
FIG. 3 is a schematic sectional view of the unit pixel (charge generator, peripheral circuit)

FIG. 3 is a schematic sectional view of the unit pixel 3 (the charge generator 32 and the peripheral circuit) in the solid-state imaging device 1. In FIG. 3, the unit pixel 3 for color imaging is shown.

For the charge generator 32 of the present embodiment, as one example, on an n-type silicon substrate 130 (semiconductor substrate NSUB of a first conductivity type), a p-type impurity layer (P-well) as a semiconductor layer of a second conductivity type is formed. Furthermore, a photo diode PD including a charge accumulation layer (first sensor region) formed by ion implantation of an impurity of the first conductivity type into the semiconductor layer of the second conductivity type is formed as a sensor part 131 (light-receiving part). That is, the n-type semiconductor substrate NSUB is used and the n-type photo diode PD is formed in the P-well as the charge generator 32. Furthermore, the transistors, interconnect layers, and so on included in the unit pixel 3 are formed on the light incidence side.

For example, the plural charge generators 32 each included in the unit pixel are formed in the substrate 130. The charge generator 32 is formed of the p-n junction in the substrate 130. For example, in the region of the charge generator 32, a charge accumulation region 141 of the n-type as the first conductivity type (first-conductivity-type region, n-type charge accumulation region) is formed in the substrate 130, and a p-type well 142 (Pwell) is formed around the charge accumulation region 141.

On the light incidence side of the substrate 130 of the charge generator 32, a light-blocking layer 133 is formed with the intermediary of an insulating layer 132 composed of silicon oxide (SiO2) or the like. In the light-blocking layer 133, an aperture 133a is formed corresponding to the region of the charge generator 32. A protective layer 134 composed of e.g. silicon nitride (SiN) is formed on the light-blocking layer 133.

On the protective layer 134, a color filter 135 that allows the passage of only light in the desired wavelength range is formed. On the color filter 135, a microlens 136 for condensing incident light on the charge generator 32 is formed.

Various kinds of transistors are formed on the insulating layer side of the substrate 130. Although not shown in the drawing, an interconnect layer including the electrodes of the transistors and multilayer metal interconnects is formed in the insulating layer 132 over the substrate 130. Furthermore, although not shown in the drawing, in the part in which the pixel signal generator 5 is disposed in the substrate 130, the respective transistors 34, 36, 40, and 42 included in the unit pixel 3 shown in FIG. 2 are formed. In addition, although not shown in the drawing, p-wells and n-wells are formed in the peripheral circuit unit in the substrate 130, and CMOS circuits are formed in these wells.

Moreover, for such a sensor part 131 (photo diode PD), a HAD structure is formed by stacking a hole accumulation region 143 (second-conductivity-type region) that is formed of a P+-type impurity region and has small thickness above the charge accumulation region 141 formed of the N+-type impurity region on the light incidence side of the NP diode. Forming the HAD structure allows suppression of noise due to unnecessary charges such as dark current. On the other hand, an insulating protective film 190 is deposited above the peripheral circuit (the pixel signal generator 5 and so on) outside the charge generator 32, and the insulating layer 132 is formed on the insulating protective film 190 integrally with that above the charge generator 32.

The hole accumulation region 143 in the present embodiment is formed of a film having the demanded thickness and negative (minus) fixed charges (hereinafter, referred to as a negative-charge accumulated layer 182), such as an insulating film at least a part of which is crystallized, above the light-receiving plane of the sensor part 131 formed of a photo diode serving as the photoelectric converter, i.e. above the light-receiving plane of the charge accumulation region 141 (first-conductivity-type region, n-type charge accumulation region) included in the photo diode. This negative-charge accumulated layer 182 is sandwiched between other insulating films (insulating layer 184 and the insulating layer 132).
<Sectional Structure of Boundary Part>

Figure 4:
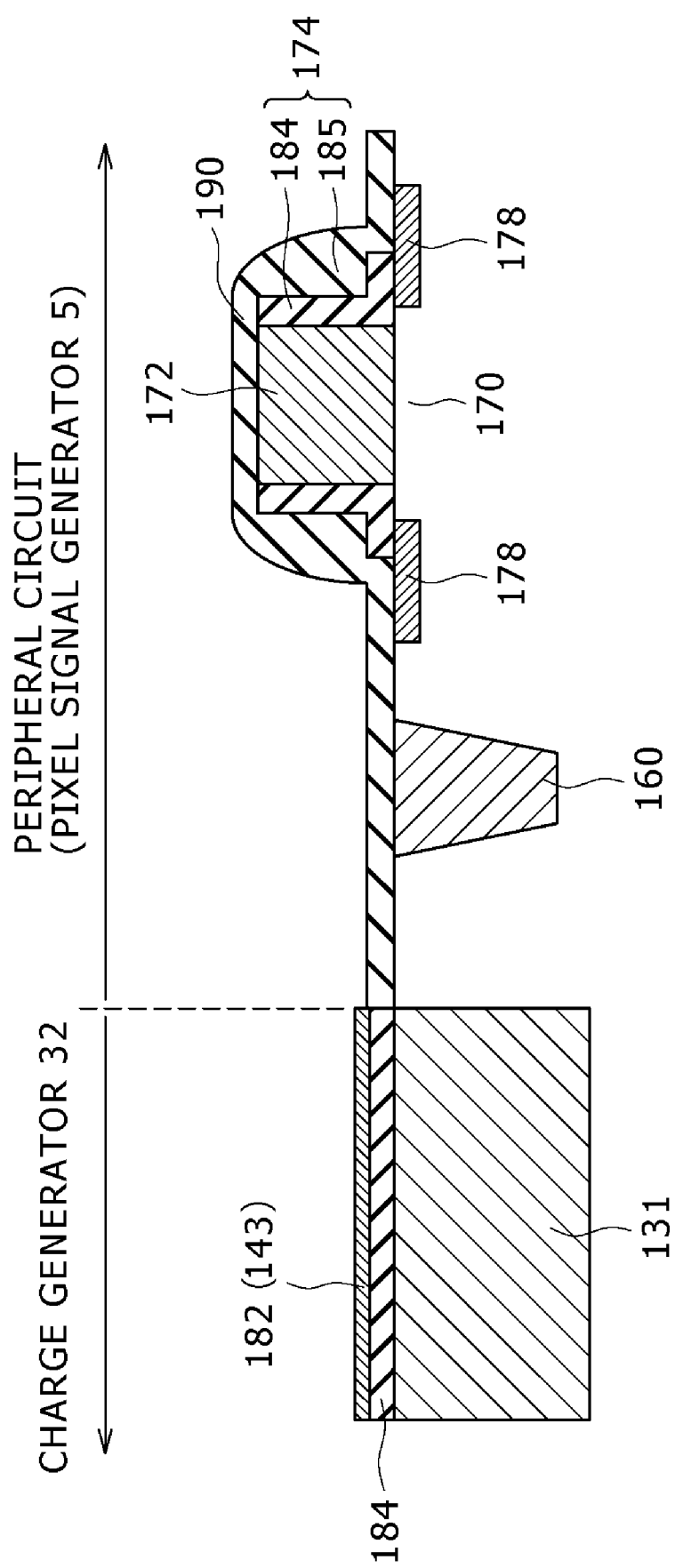
FIG. 4 is a diagram showing the outline of a sectional structure with focus on a sensor part and a transistor included in a pixel signal generator.

FIG. 4 is a diagram showing the outline of the sectional structure with focus on the boundary part between the sensor part 131 (photo diode or the like) of the charge generator 32 and the transistor included in the pixel signal generator 5 in the unit pixel 3. As shown in FIG. 4, in the configuration of the present embodiment, the charge generators 32 (represented as photo diodes in the drawing) and the transistors included in the pixel signal generators 5 are formed in the pixel array unit 10 on the substrate 130 (Si substrate). Although not shown in the drawing, transistors are formed also in the peripheral circuit unit 11. A shallow trench isolation (STI) region 160 filled with an insulator for element isolation is provided in the substrate 130, and the regions of the charge generator 32 and the transistor are separated from each other by this STI region 160.

The hole accumulation region 143 is disposed above the charge generator 32. Specifically, the insulating layer 184 composed of silicon oxide (SiO2) or the like is first disposed on the charge accumulation region 141 of the charge generator 32 (photo diode), and the negative-charge accumulated layer 182 that serves as the hole accumulation region 143 and is composed of hafnium oxide (HfO2) or the like is disposed on the insulating layer 184. In both the pixel array unit 10 and the peripheral circuit unit 11, a gate region 170 and extension diffusion regions 178 serving as the source/drain regions are provided in a transistor area.

The gate region 170 has a structure in which a sidewall 174 (insulating film spacer) is formed on both the sides of a gate electrode 172. In the present example, the insulating layer 184 composed of the same material as that of the insulating layer 184 for the charge generator 32 is first formed on both the sides of the gate electrode 172. Outside this insulating layer 184, an insulating layer 185 composed of a different material (e.g. silicon nitride (SiN)) is formed, so that the sidewall 174 is obtained.

Furthermore, the insulating protective film 190 composed of silicon nitride (SiN) or the like is deposited over the area except for the area of the charge generator 32 (over the area of the STI region 160 and the transistor). In addition, although not shown in the drawing, the insulating layer 132, the light-blocking layer 133, and the protective layer 134 are deposited over the negative-charge accumulated layer 182 for the charge generator 32, the STI region 160, and the insulating protective film 190 on the transistor side in such a manner as to collectively cover these components. The color filter 135 is formed on the protective layer 134, and the on-chip microlens 136 is formed thereon.
<Sectional Structure of Part Involving Interface States>

FIG. 5 is a diagram for explaining an advantage of the hole accumulation region 143 of the present embodiment. The hole accumulation region 143 in the present embodiment is based on a structure in which the film having negative fixed charges (the negative-charge accumulated layer 182) is formed above the charge generator 32 (the sensor part 131 (light-receiving part such as a photo diode)) to thereby generate band bending attributed to the negative fixed charges and form a hole accumulation layer at the interface. Using the negative fixed charges in the negative-charge accumulated layer 182 makes it possible to form a HAD structure without ion implantation and annealing for impurity activation.

As the material of the negative-charge accumulated layer 182, any material is available as long as it forms negative fixed charges in the film. For example, an insulating film composed of an oxide of any of the following metal elements is preferable: hafnium (Hf), zirconium (Zr), aluminum (Al), tantalum (Ta), titanium (Ti), yttrium (Y), and lanthanoids (La, Ce, Pr, Nd, Pm, Sm, Eu, Gd, Tb, Dy, Ho, Er, Tm, Yb, Lu). At least a part of the insulating film is crystallized.

Specifically, the so-called buried photo diode structure having the hole accumulation region 143 (second-conductivity-type region, p-type hole accumulation region) on the surface side of the charge accumulation region 141 (first-conductivity-type region, n-type charge accumulation region) suppresses dark current attributed to carrier generation due to interface states by turning the vicinity of the interface into the hole accumulated state. If the hole accumulated state can not be achieved by ion implantation, it is possible to turn the vicinity of the surface into the hole accumulated state not based on the impurity profile (dopant profile) in the photo diode but by fixed charges in the film above the photo diode. It is more preferable for the film in contact with this light-receiving part to have a smaller number of interface states in terms of reduction in dark current. To achieve the smaller number of interface states, a film that involves a small number of interface states and has therein negative fixed charges should be formed. As the material for forming such a film that involves a small number of interface states and has therein negative fixed charges, hafnium oxide by atomic layer deposition (ALD) is particularly preferable.

In recent years, for LSIs oriented toward lower power consumption, use of hafnium oxide with thickness on the order of several nanometers is being studied in order to achieve low leakage current. Furthermore, it is known that crystallization of hafnium oxide increases leakage current. In general, it is said that crystallization of a hafnium oxide film that is used as a gate insulating film and has thickness on the order of several nanometers occurs at a temperature of about 500° C. Therefore, countermeasures such as a method of adding Si to hafnium oxide for enhancing the heat resistance to thereby increase the crystallization temperature are being used. However, if a hafnium oxide film is not used as a gate insulating film but formed above the surface of a photo diode of an image sensor, the leakage current characteristic does not matter.

It has proved that the crystallization temperature is decreased and crystallization starts at about 300° C. if a hafnium oxide film with large thickness, which is not used for existing MOS-LSIs, is formed. Although not shown in the drawing, it has been found that extension of the heat treatment time shifts the flat-band voltage Vfb toward the higher voltage side, i.e. increases negative charges in the hafnium oxide film. Furthermore, it has been found that increase in the heat treatment temperature shifts the flat-band voltage Vfb toward the higher voltage side, i.e. increases negative charges in the hafnium oxide film. It has been found that decreasing the crystallization temperature can increase negative charges in an insulating film, and thus decreasing the crystallization temperature is favorable for the solid-state imaging device.

As above, the following facts have been newly found: a crystallized film of hafnium oxide is formed at a temperature of 400° C. or lower by forming a hafnium oxide film having proper thickness (larger than the order of several nanometers) and performing heat treatment therefor; and negative charges are formed in the hafnium oxide film along with increase in the degree of the heat treatment, i.e. along with the progression of the crystallization. The formation of negative charges along with the progression of the crystallization is the feature that should be avoided for the hafnium oxide film for an existing MOS-LSI and a gate insulating film. This is because the amount of fixed charges in the film becomes too large and the crystallization leads to increase in leakage current. However, in the present embodiment, the hafnium oxide film is very suitable for the effect to accumulate holes near the photo diode surface in the solid-state imaging device. Using the hafnium oxide film makes it possible to turn the photo diode surface into the hole accumulated state through a low-temperature process with temperatures of 400° C. or lower and can achieve suppression of dark current.

Although the hafnium oxide film is employed in the previous example, it has been found that negative fixed charges can be formed also in an insulating film composed of an oxide of any of other metal elements such as zirconium (Zr), aluminum (Al), tantalum (Ta), titanium (Ti), yttrium (Y), and lanthanoids. Forming an insulating film composed of an oxide of any of these elements above the light-receiving plane makes it possible to turn the photo diode surface into the hole accumulated state and can achieve suppression of dark current. As an additional effect, an antireflection film is formed by the negative-charge accumulated layer 182 and the insulating film (the insulating layer 132) thereon, and low dark current and high sensitivity can be achieved.

<Manufacturing Method of Comparative Example>

Figure 6A:
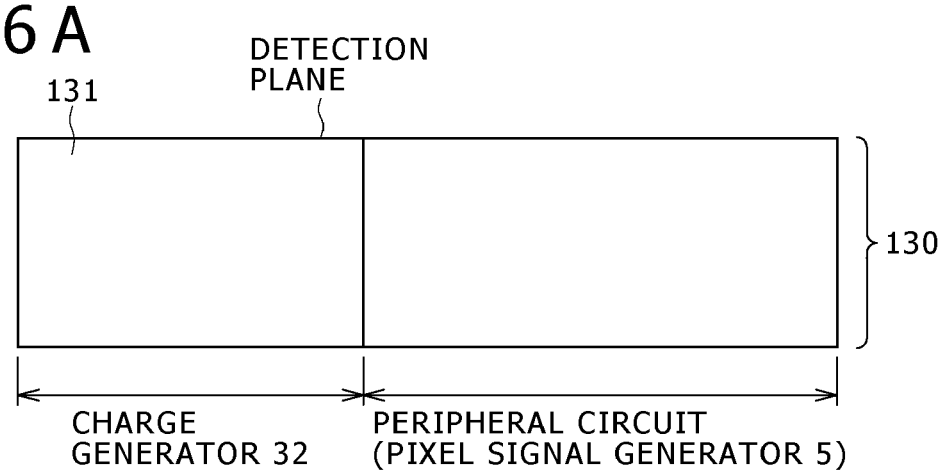
FIGS. 6A to 6C are diagrams for explaining a comparative example against the manufacturing procedure of the hole accumulation region according to the embodiment.
Figure 6B:
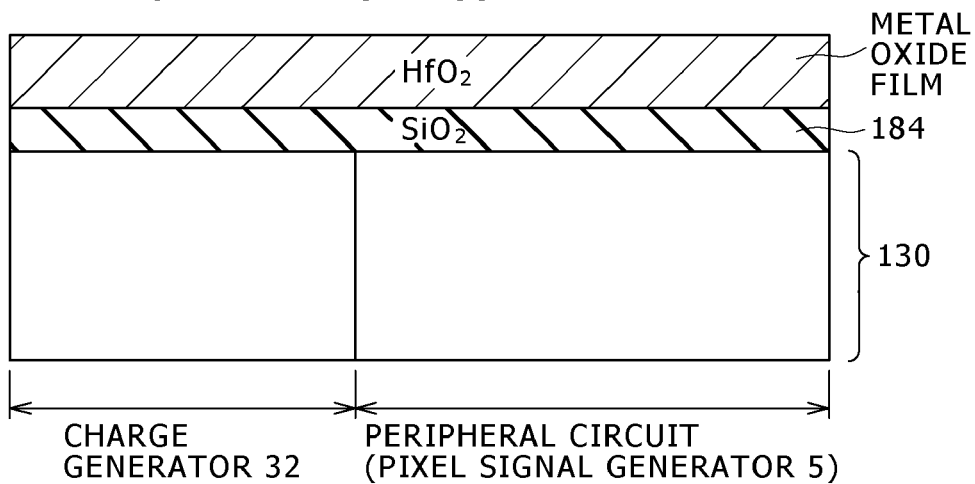
Figure 6C:
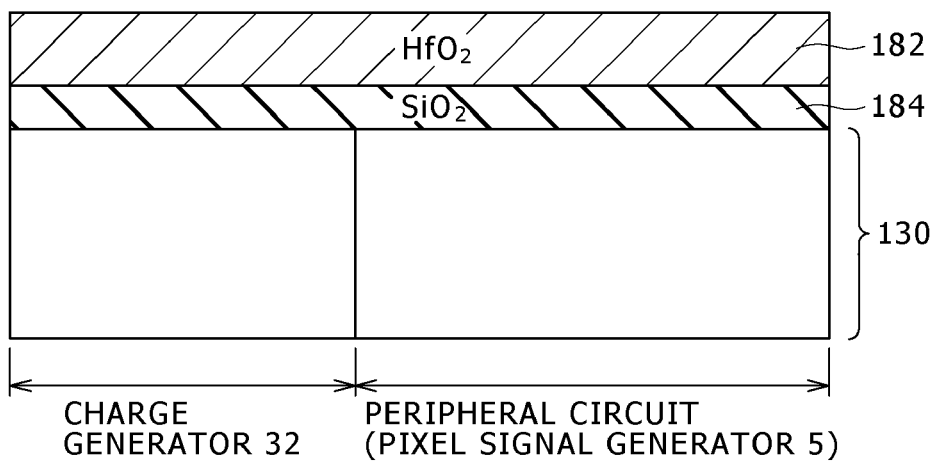

FIGS. 6A to 6C are diagrams (sectional views) for explaining a manufacturing method of a comparative example against the procedure (manufacturing steps) of manufacturing of, particularly, the hole accumulation region 143 in the solid-state imaging device 1 of the present embodiment. These diagrams are schematic sectional views and show the regions of the charge generator 32 and the pixel signal generator 5.

Initially, as shown in FIG. 6A, the plural charge generators 32 including photo diodes arranged in a two-dimensional array and peripheral circuits (the pixel signal generators 5 and so on) having transistors are formed in the pixel array unit 10 on the semiconductor substrate 130. At this time, logic circuits formed of CMOS transistors and so on are formed in the peripheral circuit unit 11.

Subsequently, as shown in FIG. 6B, a metal oxide film (e.g. hafnium oxide film) that is to serve as the negative-charge accumulated layer 182 later is formed by ALD over the entire surface of the charge generator 32 and the peripheral circuits (the pixel signal generator 5 and the peripheral circuit unit 11). In the forming of the metal oxide film by ALD, a silicon oxide film having a thickness of e.g. about 1 nm is formed as the insulating layer 184 at the interface between the metal oxide film and the surface of the substrate 130, i.e. the light-detection plane of the sensor part 131.

Subsequently, as shown in FIG. 6C, crystallization annealing of the metal oxide film is performed to form negative fixed charges in the metal oxide film, so that the metal oxide film is turned to the negative-charge accumulated layer 182.

Thereafter, although not shown in the drawing, the insulating layer 132, the light-blocking layer 133, the protective layer 134, and other films (layers) are formed over the negative-charge accumulated layer 182, so that the intended solid-state imaging device 1 is obtained. As for the area including the peripheral circuit except for the area of the charge generator 32, the insulating layer 184 and the negative-charge accumulated layer 182 are removed and the insulating protective film 190 is deposited before the deposition of the insulating layer 132.

<Problem in Comparative Example and Countermeasure Thereagainst>

As above, for forming the hole accumulation region 143, an insulating film composed of an oxide of hafnium (Hf), zirconium (Zr), aluminum (Al), tantalum (Ta), titanium (Ti), yttrium (Y), a lanthanoid, or the like is used as the negative-charge accumulated layer 182 having negative fixed charges. By forming the oxide insulating film (e.g. HfO2 film, the same applies hereinafter) above the light-receiving part, the hole accumulation region can be formed near the interface.

However, it is difficult to process the insulating film composed of an oxide of any of these metals, and possibly the unnecessary part of the insulating film can not be completely removed. For example, it is unnecessary that the oxide insulating film is left above the peripheral circuit (the pixel signal generator 5 and so on) of the charge generator 32 and thus the removal thereof is desired. However, frequently it can not be completely removed but is left. If the oxide insulating film is left above the gate of the transistor included in the pixel signal generator 5, fixed charges in the oxide insulating film will cause the shift of the threshold voltage of the transistor, which will result in a trouble of failure in driving of the transistor.

To address this problem, in the present embodiment, focusing on the feature that processing of the metal film itself as the base of the oxide insulating film is easier than processing of the oxide insulating film, the following method is employed as a method for manufacturing the hole accumulation region 143.

Specifically, a film capable of feeding oxygen (hereinafter, referred to as the oxygen-feed film) is formed in the area in which the oxide insulating film (to serve as the negative-charge accumulated layer 182 later) is desired to be left, whereas a film containing no oxygen (hereinafter, referred to as the non-oxygen-feed film) is formed in the area in which the oxide insulating film is not desired to be left. As the oxygen-feed film, a film containing oxygen can be used. For example, a silicon oxide (SiO2) film or an oxygen-doped silicon carbide (SiCO) film can be used. As the non-oxygen-feed film, a film that does not contain oxygen can be used. For example, a silicon nitride (SiN) film, a silicon carbide (SiC) film, or a nitrogen-doped silicon carbide (SiCN) film can be used.

After the forming of the oxygen-feed and non-oxygen-feed films, a film of the metal (hafnium (Hf), zirconium (Zr), aluminum (Al), tantalum (Ta), titanium (Ti), yttrium (Y), a lanthanoid, or the like) as the base of the oxide insulating film is formed over the substrate and then annealing thereof is performed. This causes reaction between the metal as the base of the oxide insulating film (base metal) on the oxygen-feed film and the underlying film, so that an oxide of the base metal is formed as an insulating film. On the other hand, the base metal of the oxide insulating film on the non-oxygen-feed film does not react with the underlying film, and thus the state of the base metal of the oxide insulating film is kept as it is.

Thereafter, only the base metal of the oxide insulating film, which is easy to process, is removed by wet etching, dry etching, or the like. This allows the oxide insulating film to be formed only in the desired area (i.e. the area of the negative-charge accumulated layer 182 serving as the hole accumulation region 143).

Also when such a manufacturing method is employed, the solid-state imaging device 1 that has a HAD structure formed by using the negative-charge accumulated layer 182 having negative fixed charges above the detection plane of the sensor part 131 can be manufactured without ion implantation and annealing for impurity activation.

<Manufacturing Method of Embodiment>

FIGS. 7A to 7D and FIGS. 8A to 8C are diagrams (sectional views) for explaining the procedure (manufacturing steps) of manufacturing of, particularly, the hole accumulation region 143 in the solid-state imaging device 1 of the present embodiment.

Initially, the STI region 160 for element isolation is formed near the surface of the substrate 130 (Si substrate). For example, an active region and a field region are defined in the substrate 130 including the pixel array unit 10 and the peripheral circuit unit 11, and a field oxide film with an STI structure is formed by forming a trench in the substrate 130 in the field region and filling the trench with an insulating film. Thereby, the active region and the field region are separated from each other.

Subsequently, an insulating film and a conductive layer such as a poly-silicon (polycrystalline silicon) layer are sequentially deposited over the entire surface of the substrate 130. Subsequently, based on a lithography technique and a reactive ion etching (RIE) technique, the insulating film and the conductive layer are selectively removed in an etching step with use of a mask for a gate electrode pattern, to thereby form gate insulating films (not shown) and the gate electrodes 172 in the transistor areas in the pixel array unit 10 and the peripheral circuit unit 11. Furthermore, the sensor parts 131 (photo diodes) are formed by implanting impurity ions into the active region in the substrate 130 of the pixel array unit 10 based on an ion implantation technique and a lithography technique with use of the mask that defines the charge generators 32. For example, if the substrate 130 is a P-type semiconductor substrate, n-type impurity ions are implanted to form the photo diodes. The step of forming the charge generators 32 and the transistors in the peripheral circuit will be referred to as an element forming step. In this step, the extension diffusion regions 178 (source/drain regions) may also be formed. Because the gate electrode 172 functions as a mask, the extension diffusion regions 178 are formed in a self-aligned manner.

Subsequently, an oxygen-feed film capable of feeding oxygen is formed on the detection plane (light-receiving plane) of the charge generator 32 (oxygen-feed film forming step). Furthermore, a non-oxygen-feed film that contains no oxygen is formed on the semiconductor substrate in the area including the peripheral circuit except for the area of the detection plane of the charge generator 32 (non-oxygen-feed film forming step). Specifically, the state is formed in which the non-oxygen-feed film does not exist but the oxygen-feed film exists on the detection plane of the charge generator 32 (the sensor part 131) as the area above which the oxide insulating film that is to serve as the negative-charge accumulated layer 182 later is desired to be left whereas the oxygen-feed film does not exist but the non-oxygen-feed film exists on the area including the peripheral circuit (the pixel signal generator 5 and so on) except for the area of the detection plane as the area above which the oxide insulating film is not desired to be left. As long as such a state is obtained, the order and schemes of the oxygen-feed film forming step and the non-oxygen-feed film forming step may be any. The following description will deal with a scheme designed in consideration of forming of the sidewall 174 for the gate electrode 172.

Initially, as shown in FIG. 7A, as a sidewall film for forming the sidewall 174 of the gate electrode 172, an oxygen-feed film (e.g. silicon oxide (SiO2) film) and, preferably, a non-oxygen-feed film (e.g. silicon nitride (SiN) film) are deposited in that order over the entire surface of the substrate 130 (in such a manner as to cover the detection plane of the charge generator 32 and the area including the peripheral circuit) (equivalent to the practical oxygen-feed film forming step). Thereafter, of the substrate 130 of the pixel array unit 10, only the charge generator 32 is covered by a resist. Using the non-oxygen-feed film for forming the sidewall film in this step is not essential. This is because a step of depositing a non-oxygen-feed film will be carried out again later.

For example, if the silicon oxide (SiO2) film is deposited as a high temperature oxide (HTO) film, the following deposition condition is employed: SiH4 and N2O are employed as the process gas; the temperature is in the range of 700° C. to 800° C.; the pressure is in the range of 50 to 200 Pa; and the film thickness is in the range of 5 nm to 20 nm. Alternatively, if a LP-TEOS (Low Pressure Tetra Ethyl Orthorhombic Silicated) film is employed as the silicon oxide (SiO2) film, the following deposition condition is employed: TEOS is employed as the process gas; the temperature is in the range of 600 to 700° C.; the pressure is in the range of 30 to 100 Pa; and the film thickness is in the range of 5 nm to 20 nm. It is known that the LP-TEOS film is excellent in the step coverage, uniformity of the thickness, the productivity, and so on and demands no gap-fill. However, the LP-TEOS has unstable film quality and thus involves a drawback that outgassing therefrom intensely occurs in a subsequent thermal step. The condition of the deposition of the silicon nitride (SiN) film is as follows: DCS (dichlorosilane) is employed as the process gas; the temperature is in the range of 650 to 750° C.; the pressure is in the range of 20 to 100 Pa; and the film thickness is in the range of 10 nm to 30 nm.

Subsequently, as shown in FIG. 7B, the multilayer film composed of the oxygen-feed film (silicon oxide (SiO2) film) and the non-oxygen-feed film (silicon nitride (SiN) film) is etched back for the gate electrode 172 by an electron beam (EB) or the like, to thereby form the sidewall 174 on both the sides of the gate electrode 172. Thereafter, the resist is removed.

Subsequently, as shown in FIG. 7C, a non-oxygen-feed film (e.g. silicon nitride (SiN) film) is deposited over the entire surface of the substrate 130 (in such a manner as to cover the detection plane of the charge generator 32 and the area including the peripheral circuit). Furthermore, as shown in FIG. 7D, the area except for the area of the charge generator 32 is covered by a resist, and the non-oxygen-feed film (silicon nitride (SiN) film) above the charge generator 32 is removed (equivalent to the practical non-oxygen-feed film forming step). If the extension diffusion regions 178 (source/drain regions) have not yet been formed, the extension diffusion regions 178 are formed.

These steps provide the state in which the non-oxygen-feed film does not exist but the oxygen-feed film exists on the detection plane of the charge generator 32 whereas the oxygen-feed film does not exist but the non-oxygen-feed film exists in the area including the peripheral circuit except for the area of the detection plane. Furthermore, in the process of the steps, the sidewall 174 can be formed on the side surfaces of the gate electrode 172 and the extension diffusion regions 178 can be formed in a self-aligned manner by using the sidewall 174, as another advantage.

Figure 8A:
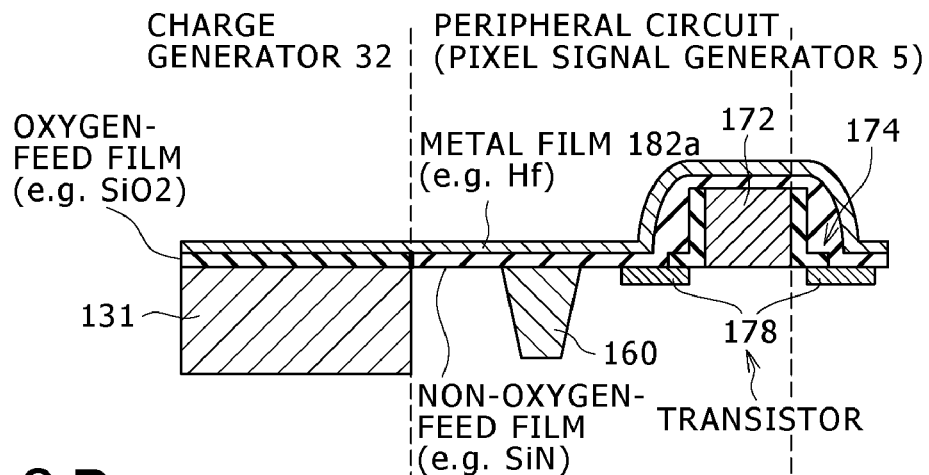
FIGS. 8A to 8C are diagrams (subsequent to FIG. 7D) for explaining the manufacturing procedure of the hole accumulation region according to the embodiment.

Subsequently, as shown in FIG. 8A, the resist is removed, and a metal film 182a that contains any of the metals (hafnium (Hf), zirconium (Zr), aluminum (Al), tantalum (Ta), titanium (Ti), yttrium (Y), lanthanoids, and so on, referred to as the base metal) as the base material of the oxide insulating film that is to serve as the negative-charge accumulated layer 182 later is deposited over the entire surface of the substrate 130 (in such a manner as to cover the detection plane of the charge generator 32 and the area including the peripheral circuit). For example, a hafnium (Hf) film is deposited to a thickness in the range of 2 to 6 nm by DC sputtering in which the sputtering power is in the range of 100 to 1000 W and the flow rate of an Ar gas is in the range of 10 to 50 sccm (standard cc/min).

Figure 8B:
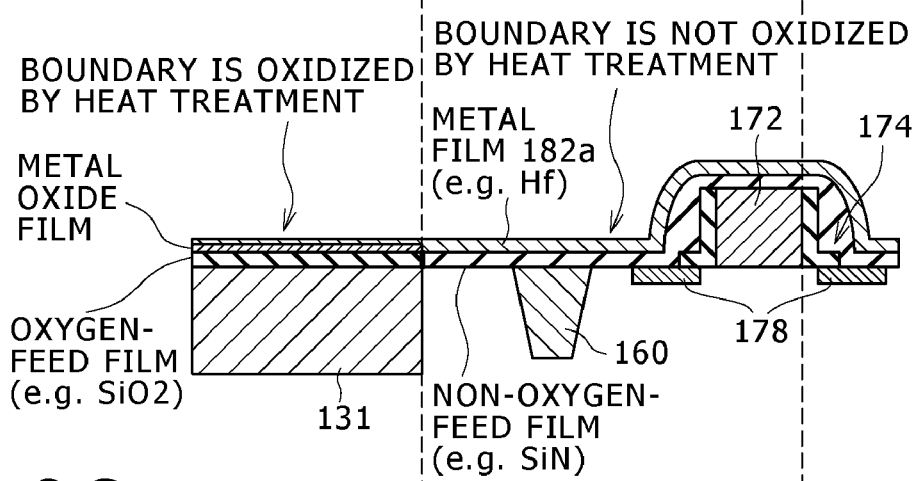

Subsequently, as shown in FIG. 8B, annealing treatment (heat treatment) is performed in a neutral gas atmosphere (inactive gas atmosphere) such as a nitrogen (N2) atmosphere, to thereby cause reaction (oxidation reaction) between the oxygen-feed film (e.g. SiO2 film) on the charge generator 32 (the sensor part 131) and the metal film 182a containing the base metal (metal material such as hafnium (Hf), zirconium (Zr), aluminum (Al), tantalum (Ta), titanium (Ti), yttrium (Y), or a lanthanoid) of the oxide insulating film across the boundary between these films. This forms the oxide insulating film (metal oxide film) of the metal element such as hafnium (Hf), zirconium (Zr), aluminum (Al), tantalum (Ta), titanium (Ti), yttrium (Y), or a lanthanoid (oxidation annealing treatment is performed). In addition, crystallization annealing treatment of the metal film 182a is performed to form negative fixed charges in the metal film 182a.

For example, the condition of the annealing treatment in a nitrogen atmosphere is as follows: the temperature is 500° C. or higher and preferably in the range of 600 to 1000° C.; the pressure is in the range of 1 to 760 Torr; and the annealing time is in the range of 1 to 30 min. If hafnium Hf is used as the base metal of the oxide insulating film, the thickness of a hafnium oxide (HfO2) film as the resulting film is set in the range of about 4 to 7 nm.

In this annealing treatment, the base metal (e.g. hafnium (Hf)) of the oxide insulating film above the substrate 130 except for the area of the charge generator 32 does not react with the underlying non-oxygen-feed film (e.g. SiN film) but remains in the state of the base metal (e.g. hafnium (Hf)) of the oxide insulating film (i.e. the unoxidized metal film 182a that remains after the heat treatment). Also above the charge generator 32, the metal film 182a that is comparatively-remote from the boundary between the oxygen-feed film and the metal film 182a and is not oxidized remains as it is.

Figure 8C:
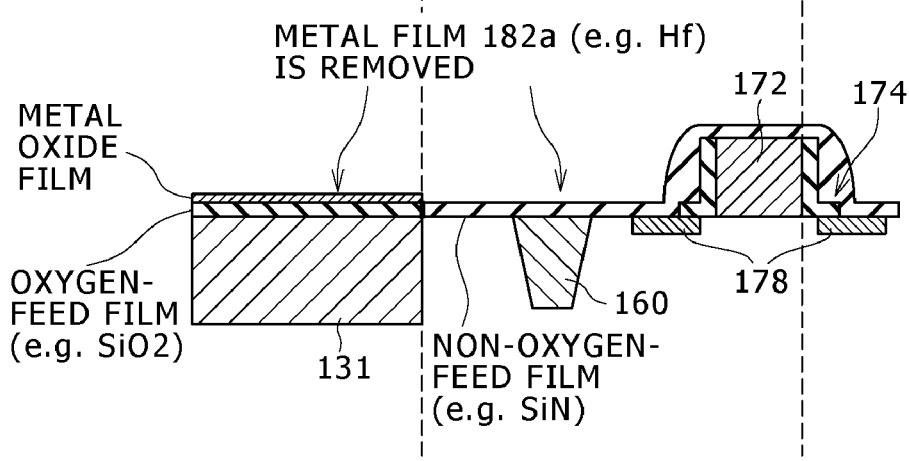
Figure 9:
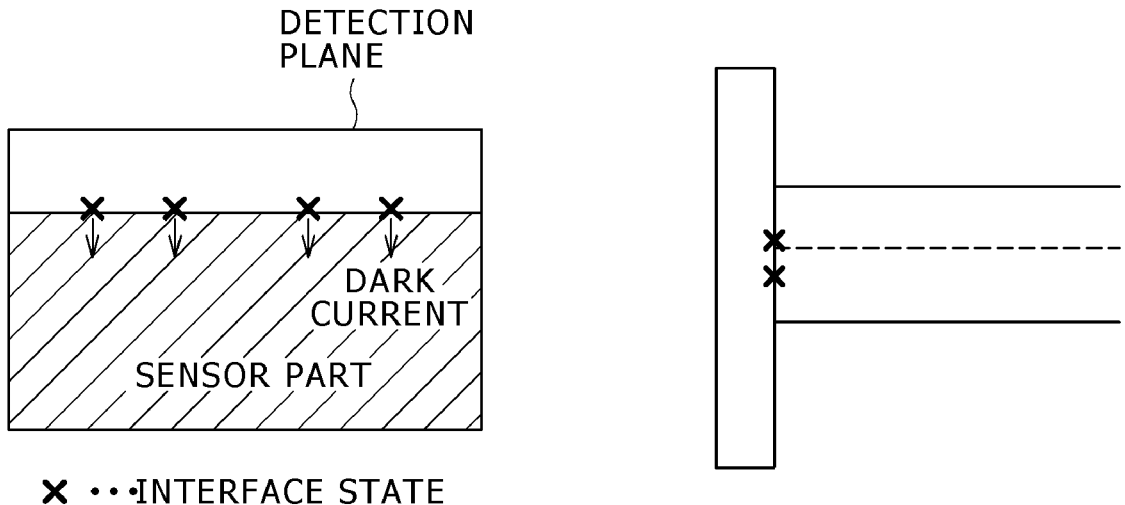
FIG. 9 is a diagram for explaining dark current in a configuration without a HAD structure.
Figure 10:
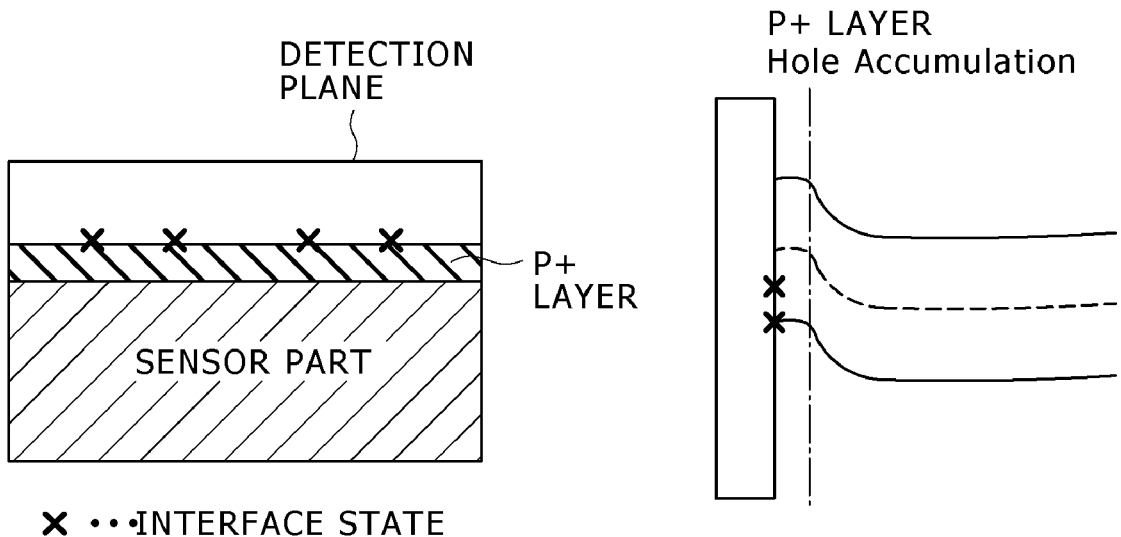
FIG. 10 is a diagram for explaining an advantage of a HAD structure formed by ion implantation.

Thereafter, as shown in FIG. 8C, removal treatment such as etching is performed for the entire area above the charge generator 32 and the peripheral circuit (the pixel signal generator 5). Thereby, the metal film 182a is removed from the area including the peripheral circuit except for the area of the sensor part 131, whereas the metal oxide film is left above the sensor part 131. Specifically, only the unoxidized base metal (e.g. hafnium (Hf)) that remains above the substrate 130 except for the area of the charge generator 32 and is not turned to the oxide insulating film is removed by wet etching, dry etching, or the like. Thereby, the oxide insulating film is formed only in the area of the negative-charge accumulated layer 182 that serves as the hole accumulation region 143 above the charge generator 32. The oxide insulating film can be formed only above the detection plane of the charge generator 32 (the sensor part 131), and it is possible to allow this oxide insulating film to function as the negative-charge accumulated layer 182. The unoxidized metal film that remains above the detection plane of the charge generator 32 after the annealing treatment is also simultaneously removed.

For example, if wet etching is employed, the removal with use of a wet chemical allows the forming of the oxide insulating film only above the charge generator 32. As the wet chemical, e.g. an aqueous solution of a dilute hydrofluoric (DHF) acid can be used if the base metal of the oxide insulating film is hafnium (Hf). Because hafnium (Hf) can be easily removed by a dilute hydrofluoric (DHF) acid, a hafnium oxide (HfO2) film can be formed only above the charge generator 32.

As above, in the manufacturing method of the present embodiment, the oxygen-feed film such as a silicon oxide (SiO2) film is formed in the area in which the oxide insulating film to serve as the negative-charge accumulated layer 182 is desired to be left, whereas the non-oxygen-feed film such as a silicon nitride (SiN) film is formed in the area in which the oxide insulating film to serve as the negative-charge accumulated layer 182 is not desired to be left. Thereafter, the film of the base metal, such as hafnium (Hf), of the oxide insulating film is deposited over the entire surface of the substrate 130, and then annealing is performed in an inactive gas atmosphere. Thereby, the base metal film on the oxygen-feed film in the area of the charge generator 32 reacts with the underlying oxygen-feed film, so that a film of an oxide of the base metal is formed as an insulating film. This insulating film is formed as the metal film 182*a* by crystallization annealing, and is suitable as the negative-charge accumulated layer 182 because negative fixed charges are formed in the metal film 182*a*.

On the other hand, the base metal film on the non-oxygen-feed film, such as a silicon nitride (SiN) film, deposited in the area in which the oxide insulating film to serve as the negative-charge accumulated layer 182 is not desired to be left does not react with the underlying non-oxygen-feed film but remains as it is. Therefore, the base metal film, including the unreacted base metal film in the area of the negative-charge accumulated layer 182, can be easily removed by subsequent etching, so that the oxide insulating film such as a hafnium oxide (HfO2) film can be formed only in the desired area (the area of the negative-charge accumulated layer 182).

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a solid-state imaging device in which a charge generator that detects an electromagnetic wave and generates signal charges is formed on a semiconductor substrate and a negative-charge accumulated layer having negative fixed charges is formed above a detection plane of the charge generator, the method comprising the steps of:
   forming an oxygen-feed film capable of feeding oxygen on the detection plane of the charge generator;
   forming a metal film that covers the oxygen-feed film on the detection plane of the charge generator; and
   performing heat treatment for the metal film in an inactive atmosphere to thereby form an oxide of the metal film between the metal film and the oxygen-feed film on the detection plane of the charge generator, the oxide being to serve as the negative-charge accumulated layer.

2. The method for manufacturing the solid-state imaging device according to claim 1, wherein
   in the performing heat treatment, a part of the oxide of the metal film is crystallized to thereby form the negative-charge accumulated layer.

3. The method for manufacturing the solid-state imaging device according to claim 1, wherein
   in the forming a metal film, the metal film is formed by sputtering.

4. The method for manufacturing the solid-state imaging device according to claim 1, wherein
   in the forming a metal film, a metal material containing any of hafnium, zirconium, aluminum, tantalum, titanium, yttrium, and a lanthanoid is used as a material of the metal film.

5. The method for manufacturing the solid-state imaging device according to claim 1, wherein
   in the performing heat treatment, the heat treatment is performed in a nitrogen atmosphere at a temperature equal to or higher than 500° C.

6. A method for manufacturing a solid-state imaging device in which a charge generator that detects an electromagnetic wave and generates signal charges and a peripheral circuit that includes a pixel signal generator, a drive controller, and a signal processor are formed on a semiconductor substrate, the pixel signal generator generating a pixel signal based on signal charges generated by the charge generator, the drive controller being disposed on periphery of the charge generator and the pixel signal generator and having a control circuit function to read out a pixel signal generated by the pixel signal generator to outside of the pixel signal generator and the device, the signal processor processing a pixel signal read out from the pixel signal generator, a negative-charge accumulated layer that has negative fixed charges being formed above a detection plane of the charge generator, the method comprising the steps of:
   forming an oxygen-feed film capable of feeding oxygen on the detection plane of the charge generator;
   forming a non-oxygen-feed film that contains no oxygen on the semiconductor substrate in an area including the peripheral circuit except for an area of the detection plane of the charge generator;
   forming a metal film that covers the oxygen-feed film on the detection plane of the charge generator and the non-oxygen-feed film in the area including the peripheral circuit except for the area of the detection plane of the charge generator;
   performing heat treatment for the metal film in an inactive atmosphere to thereby form an oxide of the metal film between the metal film and the oxygen-feed film on the detection plane of the charge generator, the oxide being to serve as the negative-charge accumulated layer; and
   removing the metal film that is unoxidized and remains after the heat treatment.

7. The method for manufacturing the solid-state imaging device according to claim 2, wherein
   in the performing heat treatment, a part of the oxide of the metal film is crystallized to thereby form the negative-charge accumulated layer.

8. The method for manufacturing the solid-state imaging device according to claim 2, wherein
   in the forming a metal film, the metal film is formed by sputtering.

9. The method for manufacturing the solid-state imaging device according to claim 2, wherein
   in the forming a metal film, a metal material containing any of hafnium, zirconium, aluminum, tantalum, titanium, yttrium, and a lanthanoid is used as a material of the metal film.

10. The method for manufacturing the solid-state imaging device according to claim 2, wherein
    in the performing heat treatment, the heat treatment is performed in a nitrogen atmosphere at a temperature equal to or higher than 500° C.

11. The method for manufacturing the solid-state imaging device according to claim 2, wherein
    the forming an oxygen-feed film and the forming a non-oxygen-feed film include the sub-steps of:
       forming the oxygen-feed film that covers the detection plane of the charge generator and the area including the peripheral circuit;
       forming a sidewall for a gate electrode of a transistor in the peripheral circuit by using one part of the oxygen-feed film in the area including the peripheral circuit while removing the other part of the oxygen-feed film in the area including the peripheral circuit;
       forming the non-oxygen-feed film that covers the detection plane of the charge generator and the area including the peripheral circuit; and removing the non-oxygen-feed film above the detection plane of the charge generator.

12. The method for manufacturing the solid-state imaging device according to claim 2, wherein
the forming an oxygen-feed film and the forming a non-oxygen-feed film include the sub-steps of:
  forming the oxygen-feed film and the non-oxygen-feed film in that order from a semiconductor substrate side in such a manner as to cover the detection plane of the charge generator and the area including the peripheral circuit;
  forming a sidewall for a gate electrode of a transistor in the peripheral circuit by using one part of the oxygen-feed film and the non-oxygen-feed film in the area including the peripheral circuit while removing the other part of the oxygen-feed film and the non-oxygen-feed film in the area including the peripheral circuit;
  forming the non-oxygen-feed film that covers the detection plane of the charge generator and the area including the peripheral circuit; and
  removing the non-oxygen-feed film above the detection plane of the charge generator.

13. The method for manufacturing the solid-state imaging device according to claim 2, further comprising the step of
forming a transistor in the peripheral circuit on a detection plane side of the semiconductor substrate.

* * * * *